US009448878B2

United States Patent
Alarcon et al.

(10) Patent No.: US 9,448,878 B2
(45) Date of Patent: *Sep. 20, 2016

(54) CLOCK DOMAIN CROSSING SERIAL INTERFACE

(71) Applicant: BROADCOM CORPORATION, Irvine, CA (US)

(72) Inventors: Veronica Alarcon, San Jose, CA (US); Walid Nabhane, Long Valley, NJ (US); Mark Norman Fullerton, Austin, TX (US); Love Kothari, Sunnyvale, CA (US); Ronak Subhas Patel, Sunnyvale, CA (US); Chih-Tsung Hsieh, Taipei (TW); Hao-zheng Lee, Taipei (TW)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/631,709

(22) Filed: Feb. 25, 2015

(65) Prior Publication Data

US 2015/0186209 A1    Jul. 2, 2015

Related U.S. Application Data

(63) Continuation of application No. 13/950,713, filed on Jul. 25, 2013, now Pat. No. 8,996,736.

(60) Provisional application No. 61/759,470, filed on Feb. 1, 2013, provisional application No. 61/836,903, filed (Continued)

(51) Int. Cl.
*G06F 3/00* (2006.01)
*G06F 11/10* (2006.01)

(Continued)

(52) U.S. Cl.
CPC .......... *G06F 11/1048* (2013.01); *G01R 31/36* (2013.01); *G05F 1/625* (2013.01); *G06F 1/26* (2013.01); *G06F 1/3206* (2013.01); *G06F 1/3287* (2013.01); *G06F 11/1016* (2013.01); *G06F 11/3062* (2013.01); *G06F 11/3093* (2013.01); *G06F 13/126* (2013.01); *G11C 7/106* (2013.01); *G11C 7/1072* (2013.01); *H02J 7/0029* (2013.01); *G01R 19/003* (2013.01);

(Continued)

(58) Field of Classification Search
CPC ........ G06F 13/126; G06F 1/625; G06F 1/26; G06F 1/3206; G06F 1/3287; G06F 11/3058; G06F 11/1048; G06F 11/1016; G06F 11/3062; G06F 11/3093; G06F 11/3031; G01R 31/36; G01R 19/003; G01R 31/40; H02J 7/0029; G11C 7/106; G11C 7/1072; Y02B 40/90

See application file for complete search history.

(56) References Cited

U.S. PATENT DOCUMENTS 6,725,388 B1 * 4/2004 Susnow ............... G06F 5/10
                                                    713/400
7,107,393 B1 * 9/2006 Sabih .................. G06F 5/08
                                                    711/109

(Continued)

*Primary Examiner* — Jing-Yih Shyu
(74) *Attorney, Agent, or Firm* — McDermott Will & Emery LLP

(57) ABSTRACT

A method for serial interface clock domain crossing includes identifying a data communication command received over a serial interface. An address is decoded to determine whether the address falls within a direct latch address range of a register bank. Data is communicated over the serial interface. A multiplexed output clock is generated, for writing to and reading from the register bank, based on at least one of a current system operating state and a refresh control signal from a host processor.

20 Claims, 6 Drawing Sheets

Related U.S. Application Data on Jun. 19, 2013, provisional application No. 61/836,886, filed on Jun. 19, 2013, provisional application No. 61/836,895, filed on Jun. 19, 2013, provisional application No. 61/836,306, filed on Jun. 18, 2013, provisional application No. 61/836,327, filed on Jun. 18, 2013, provisional application No. 61/834,513, filed on Jun. 13, 2013, provisional application No. 61/833,598, filed on Jun. 11, 2013, provisional application No. 61/759,470, filed on Feb. 1, 2013.

(51) Int. Cl.

| | |
|---|---|
| *G05F 1/625* | (2006.01) |
| *G06F 13/12* | (2006.01) |
| *G06F 1/26* | (2006.01) |
| *G01R 31/36* | (2006.01) |
| *H02J 7/00* | (2006.01) |
| *G06F 1/32* | (2006.01) |
| *G11C 7/10* | (2006.01) |
| *G06F 11/30* | (2006.01) |
| *G01R 31/40* | (2014.01) |
| *G01R 19/00* | (2006.01) |

(52) U.S. Cl.
CPC ........... *G01R 31/40* (2013.01); *G06F 11/3031* (2013.01); *G06F 11/3058* (2013.01); *Y02B 60/1282* (2013.01)

(56) References Cited

U.S. PATENT DOCUMENTS

| | | | | |
|---|---|---|---|---|
| 7,873,762 | B2* | 1/2011 | Wang | G06F 5/14 375/376 |
| 8,867,573 | B2* | 10/2014 | Kolinummi | G06F 13/4059 365/221 |
| 2002/0126789 | A1* | 9/2002 | Georges | H04J 3/0691 375/377 |
| 2006/0209784 | A1* | 9/2006 | Cheng Gang | H03M 9/00 370/350 |
| 2006/0214902 | A1* | 9/2006 | Tamura | G06F 3/1431 345/100 |
| 2007/0286223 | A1* | 12/2007 | Chang | G06F 1/3203 370/413 |
| 2013/0013950 | A1* | 1/2013 | Maddigan | H04L 7/02 713/400 |

* cited by examiner

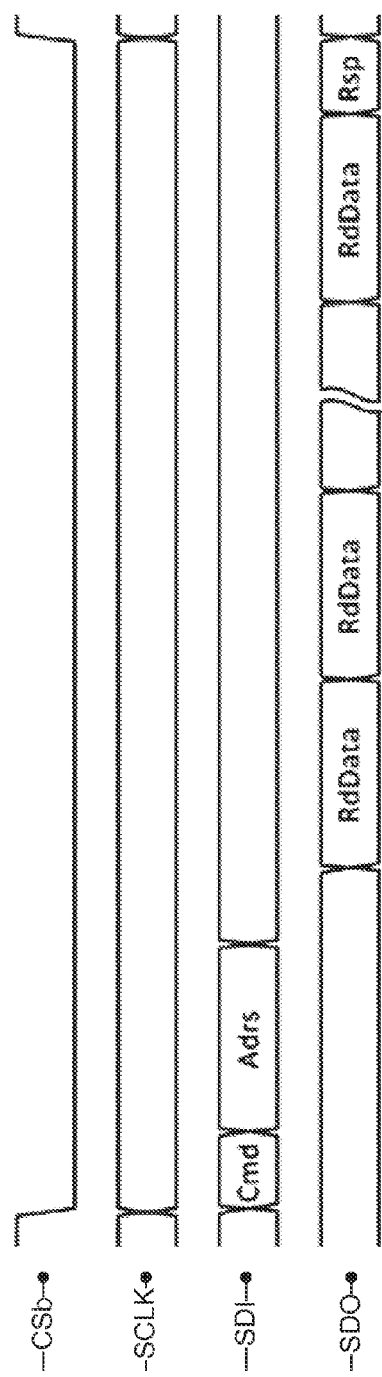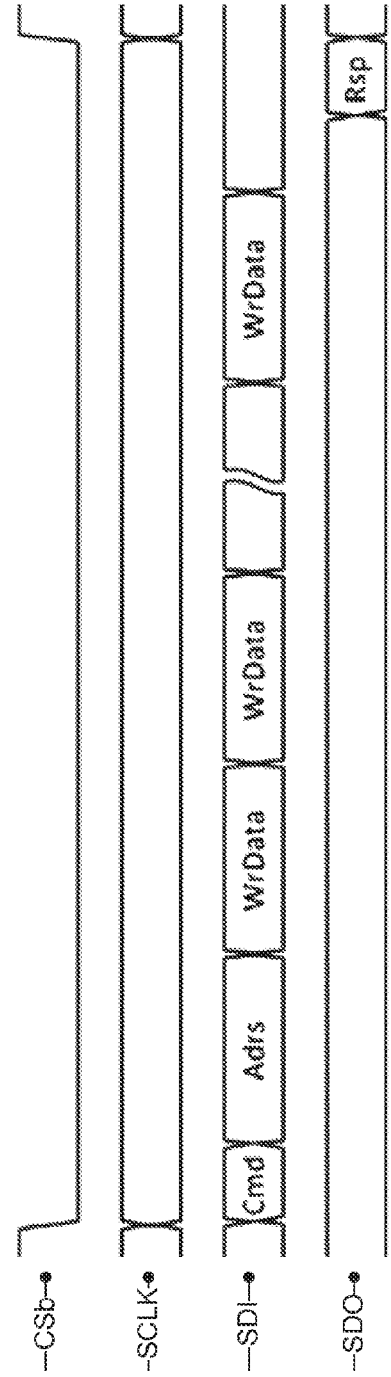
FIG. 5A
FIG. 5B

CLOCK DOMAIN CROSSING SERIAL INTERFACE

CROSS-REFERENCE TO RELATED APPLICATIONS

This application claims the benefit of U.S. application Ser. No. 13/950,713, filed Jul. 25, 2013, which claims the benefit of U.S. Provisional Application No. 61/759,470, filed Feb. 1, 2013; U.S. Provisional Application No. 61/833,598, filed Jun. 11, 2013; U.S. Provisional Application No. 61/834,513, filed Jun. 13, 2013; U.S. Provisional Application No. 61/836,327, filed Jun. 18, 2013; U.S. Provisional Application No. 61/836,306, filed Jun. 18, 2013; U.S. Provisional Application No. 61/836,895, filed Jun. 19, 2013; U.S. Provisional Application No. 61/836,886, filed Jun. 19, 2013; and U.S. Provisional Application No. 61/836,903, filed Jun. 19, 2013, the entire contents of each of which are hereby incorporated herein by reference. This application also makes reference to U.S. patent application Ser. No. 13/950,725 titled "Power and System Management Information Visibility" and filed on even date herewith; U.S. patent application Ser. No. 13/950,738 titled "Power Mode Register Reduction and Power Rail Bring Up Enhancement" and filed on even date herewith; U.S. patent application Ser. No. 13/950,750 titled "Dynamic Power Profiling" and filed on even date herewith; U.S. patent application Ser. No. 13/950,762 titled "Charger Detection and Optimization Prior to Host Control" and filed on even date herewith; U.S. patent application Ser. No. 13/950,769 titled "Enhanced Recovery Mechanism" and filed on even date herewith; and U.S. patent application Ser. No. 13/950,776 titled "Dynamic Power Mode Switching Per Rail" and filed on even date herewith, the entire contents of each of which are hereby incorporated herein by reference.

BACKGROUND

Battery-powered computing systems and devices have been adopted for use in many aspects of daily life. As these systems and devices are more widely adopted and used in place of other computing systems and devices, they are designed to be more flexible and powerful, but are also more complex. With advances in the design of battery-powered computing devices, the availability of sufficient power for the devices continues to be an ongoing concern. Thus, certain elements in battery-powered computing systems are designed to operate at relatively low frequencies to conserve power. On the other hand, other elements in battery-powered computing systems should operate at relatively higher frequencies to execute various applications quickly and concurrently.

In this context, different elements in computing systems, each of which may operate at a respective operating frequency, may need to communicate data among each other. Further, because physical space is constrained, there is an incentive to design interfaces between the elements in a system using few device pins.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIG. 5A illustrates a burst read timing diagram for communications over the serial interface of the system of FIG. 1 according to an example embodiment.

FIG. 5B illustrates a burst write timing diagram for communications over the serial interface of the system of FIG. 1 according to an example embodiment.

DETAILED DESCRIPTION

Different elements in computing systems, each of which may operate at a respective operating frequency, may need to communicate data among each other. Further, because physical space is constrained, there is an incentive to design interfaces between the elements in a system using few device pins.

In a system including a host processor and a power management unit, it may be necessary to communicate quickly between the host processor and the power management unit, for example, if power rails in the system are controlled by the host processor via communication with the power management unit. It is noted that, in newer battery-powered communications systems, a greater number of different power rails are being incorporated, and the quick transition of power rails is an ongoing concern for power conservation.

In this context, if the general interface between the host processor and the power management unit is too slow to support high speed communication of commands for transitioning the power rails, other solutions may be needed. For example, in addition to any general communications interface between the host processor and the power management unit, dedicated power control pins, for example, may be relied upon to transition at least certain power rails quickly. These dedicated pins are associated with added system cost, for various reasons. Particularly, the pins require physical space in the system and in the associated circuitry and logic of the system.

In an effort to address certain problems described above, aspects of a clock domain crossing serial interface, direct latching over the serial interface, and response codes are described herein. In various embodiments, a data communication command received over a serial interface is identified, and an address received over the serial interface is resolved to access a register bank. In a write operation, depending upon whether the address falls within a direct latch address range of the register bank, data may be directly latched into a direct latch register of the register bank or into a first-in-first-out (FIFO) registers. For both read and write operations, reference may be made to a status register of the serial interface to identify or mitigate error conditions, and wait times may be relied upon to account for a clock domain crossing. After each of the read and write operations, a response code including a status indictor may be communicated.

Turning now to the drawings, an introduction and general description of exemplary embodiments of a system is provided, followed by a description of the operation of the same.

I. System Introduction

Figure 1:
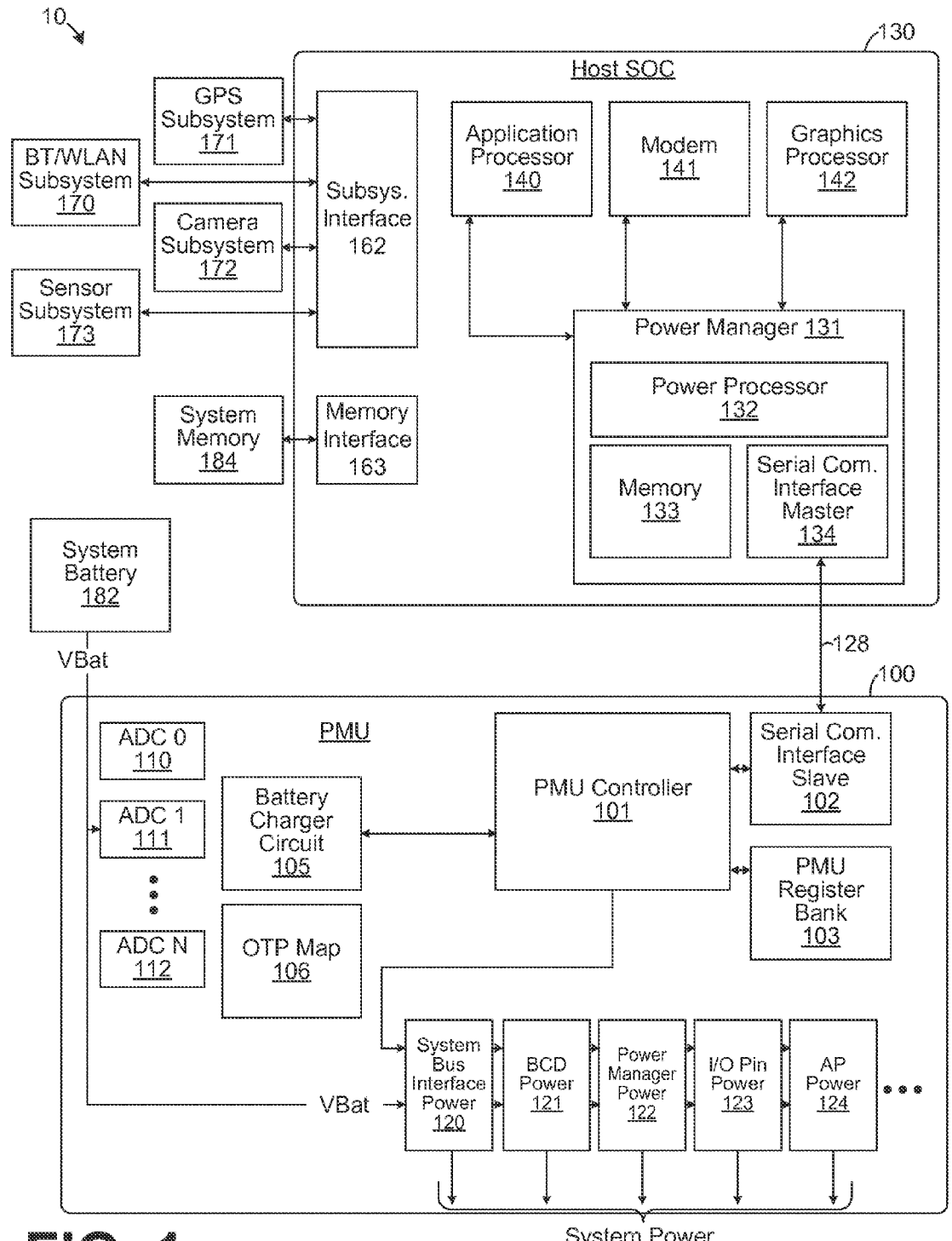
FIG. 1 illustrates a system having a serial interface for clock domain crossing according to an example embodiment.

FIG. 1 illustrates a system 10 having a serial interface 128 for clock domain crossing according to an example embodiment. The system 10 may embody a computing device that includes a number of general and/or specific purpose circuits, processing circuits, processors, registers, memories, sensors, displays, etc. In one embodiment, the system 10 may embody a handheld or portable computing device which is powered from charge stored in a battery. In various embodiments, the system 10 may be embodied as part of a cellular telephone, tablet computing device, laptop computer, or other computing device. Alternatively, because the embodiments described herein are not limited to use in handheld or portable computing devices, the system 10 may be embodied as part of a desktop or set top computing device, for example. Although not illustrated in FIG. 1, it should be appreciated that the system 10 may include one or more displays, microphones, speakers, buttons, indicator lights, haptic feedback elements, memory card readers, etc.

Among other elements, the system 10 includes a power management unit (PMU) 100, a host system-on-chip (SOC) 130, a system battery 182, and a system memory 184. The system 10 also includes certain subsystems such as a bluetooth/wireless local area network (WLAN) subsystem 170, a global positioning system (GPS) subsystem 171, a camera subsystem 172, and a sensor subsystem 173.

The system battery 182 may be embodied as any rechargeable battery suitable for the application, such as a lithium-ion, nickel-metal-hydride, or other battery variant, without limitation. The system memory 184 may be embodied as a volatile and/or non-volatile random access memory or combination thereof. The system memory 184 may store computer-readable instructions thereon that, when executed by one or more of the processors 140-142 of the host SOC 130, for example, direct the processors 140-142 to execute various aspects of the embodiments described herein.

In general, the PMU 100 controls and/or facilitates control of the distribution of power from the system battery 182 to the elements of the system 10, such as the host SOC 130, the subsystems 170-173, and the system memory 184, for example. As further described below, depending upon the operating state of the system 10 and/or other factors, the PMU 100 may control the distribution of power to one or more elements of the system 10, or the PMU 100 may receive instructions to control the distribution of power to one or more elements of the system 10.

Among other elements, the PMU 100 includes a PMU controller 101, a serial communications interface slave 102, a PMU register bank 103, a battery charger circuit 105, a one time programmable (OTP) map 106, a number 0-N of analog-to-digital (ADC) circuits 110-112, and a number of power rail circuits 120-124. It is noted that FIG. 1 illustrates a representative example of elements of the PMU 100, and it should be appreciated that the PMU 100 may include other elements in various embodiments. For example, the PMU 100 may include a number of power rail circuits in addition to the power rail circuits 120-124.

Among other elements, the host SOC 130 includes general and/or application specific processors. In FIG. 1, the host SOC 130 includes a power manager 131, an application processor 140, a modem 141, and a graphics processor 142. In various embodiments, the host SOC 130 may omit one or more of the processors 140-142 or include processors in addition to the processors 140-142. The host SOC 130 also includes a subsystem interface 162 and memory interface 163. The subsystem interface 162 and the memory interface 163 electrically and communicatively couple the subsystems 170-173 and the system memory 184 to the host SOC 130 and, particularly, to one or more of the processors 140-142.

The application processor 140 may be embodied as a general purpose processor for executing various applications. For example, the application processor 140 may execute an underlying operating system along with applications such as e-mail, short message service (SMS), telephone, camera, web-browser, and other applications, without limitation. As compared to the PMU 100 and/or the power manager 131, the application processor 140 may consume relatively more power during operation. The modem 141 may include a cellular-based (or similar) communications processor for the communication of data wirelessly in connection with radio-frequency front end circuitry, and the graphics processor 142 may include a processor for driving a display of the system 10.

The power manager 131 includes a power processor 132, a memory 133, and a serial communications interface master 134. The power processor 132 may be embodied as a relatively small and low power processor or processing circuit for interfacing with the PMU 100 via a serial interface 128. In one embodiment, the serial communications interface master 134 of the power manager 131 controls the serial interface 128, although the PMU 100 may control the serial interface 128 in other embodiments. The memory 133 stores computer-readable instructions for execution by the power processor 132.

II. System Operation

With reference to the elements of the system 10 introduced above, aspects of the operation of the system 10 are described below.

A. PMU Operation

The PMU 100 may be designed, adapted, and configured to perform operations that support the host SOC 130, the subsystems 170-173, the system memory 184, and other elements of the system 10. For example, the PMU 100 may remain in a powered-on mode of operation, even when the host SOC 130 and other elements of the system 10 are in a powered-off mode of operation. The PMU 100 may be maintained in the powered-on mode of operation so as to gather system parameters for the system 10 and provide power to certain elements in the system 10 from time to time.

The PMU controller 101 generally coordinates and controls the operations of the PMU 100. The PMU controller 101 may be embodied as a general or specific purpose circuit, processing circuit, processor, state machine, etc. The PMU controller 101 interfaces with the serial communications interface slave 102 to communicate with the host SOC 130 over the serial interface 128, interfaces with the power rail circuits 120-124 to control power to the system 10, and interfaces with the PMU register bank 103 to store and access data associated with the status of the PMU 100 and the system 10. Additionally, the PMU controller 101 interfaces with other elements of the PMU 100, such as the ADCs 110-112 and the OTP map 106.

The serial communications interface slave 102 comprises one end of the serial interface 128 that facilitates communication between the PMU 100 and the host SOC 130. Among various modes and states of operation of the system 10, the serial interface 128 is relied upon to communicate system parameters or system status data between the PMU 100 and the host SOC 130. For example, the PMU 100 may maintain system parameters or system status data regarding a battery voltage of the system battery 182 (i.e., VBat), a temperature of one or more components of the system 10, voltage and/or mode settings of the power rails 120-124, etc. According to aspects of the embodiments described herein, the serial communications interface slave 102 identifies and distinguishes among read and write data communications commands, identifies and distinguishes among addresses for access to certain registers in the PMU 100, and accounts for a clock domain crossing in association with the data communication over the serial interface 128. Further aspects of the serial communications interface slave 102 are described below.

The OTP map 106 includes an array of programmable fuses or similar circuit elements that may be programmed to retain a logical value. The logical values retained in the OTP map 106 may be relied upon to store initial voltage settings, for example, for one or more of the power rail circuits 120-124. That is, the OTP map 106 may store voltage and/or current settings for power supplied by one or more of the system bus interface power rail 120, the BCD power rail 121, the power manager power rail 122, the I/O pin power rail 123, and/or the application processor (AP) power rail 124. Depending upon the operating status of the system 10, the PMU controller 101 may directly set the voltage and/or current settings for one or more of the power rails 120-124 based on the logical values retained in the OTP map 106, for example, and/or other factors. Additionally or alternatively, depending upon the operating status of the system 10, the PMU controller 101 may set voltage and/or current settings for one or more of the power rails 120-124 based on instructions received from the host SOC 130 via the serial interface 128, as further described below.

B. Host SOC Operation

The host SOC 130 may be generally embodied as a full system-on-chip semiconductor device. In this sense, the host SOC 130 integrates various general and/or application specific processors and processing circuits into a single integrated circuit package, reducing space. Overall, the power manager 131 of the host SOC 130 supports the host SOC 130 and the power requirements of the host SOC 130.

Figure 2:
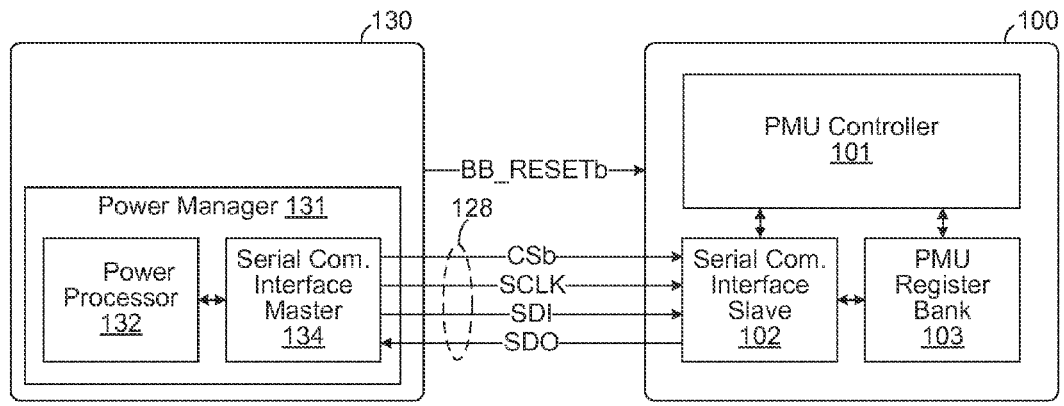
FIG. 2 illustrates the serial interface of the system of FIG. 1 according to an example embodiment.

FIG. 2 illustrates the serial interface 128 of the system 10 of FIG. 1 according to an example embodiment. As illustrated, the serial interface 128 is coupled between the serial communications interface master 134 of the power manager 131 (of the host SOC 130) and the serial communications interface slave 102 of the PMU 100. The serial interface 128 includes the CSb, SCLK, SDI, and SDO interface channels, as illustrated. In one example embodiment, the serial interface 128 may operate at a frequency of about 20 Mhz, although the internal operating frequency of the PMU 100 may be about 32Khz, to conserve power. It is noted, however, that the serial interface 128 and the PMU 100 may each operate at any suitable respective frequencies, without limitation.

Generally, the CSb channel is relied upon in the serial interface 128 as a reset, hold, or activity signal. In one embodiment, the serial interface 128 may be active when the logic level of the CSb channel is held low. The SCLK channel is relied upon in the serial interface 128 as a synchronous clock. The SDI channel is relied upon in the serial interface 128 to communicate data from the serial communications interface master 134 to the serial communications interface slave 102, and the SDO channel is relied upon in the serial interface 128 to communicate data from the serial communications interface slave 102 to the serial communications interface master 134. As illustrated in FIG. 2, a refresh control signal BB_RESETb may also be communicated from the host SOC 130 to the PMU 100, for use in certain cases described in further detail below.

In one embodiment, as further described below, the serial interface 128 may communicate (e.g., receive and transmit) 16-bit data words and support bursts of up to 16-words, although other data chunks and bursts are within the scope and spirit of the embodiments described herein. The serial interface 128 incorporates mechanisms to detect certain protocol and/or communications errors, and uses response codes to indicate certain errors. The serial communications interface slave 102 synchronizes writes to a lower frequency clock domain as compared to the operating frequency of serial interface 128 itself (i.e., the SCLK synchronous clock driven by the serial communications interface master 134). To facilitate certain lower frequency clock domain writes, the serial communications interface slave 102 includes one or more synchronizing FIFO registers. However, the serial communications interface slave 102 also permits higher frequency SCLK domain writes to direct latch registers. In some embodiments, reads from the PMU 100 may occur in the SCLK domain (e.g., 20 MHz) for both PMU domain registers (e.g., 32 KHz registers) and the direct latch registers. The serial communications interface slave 102 also accounts for or avoids metastability or unsettled or transitioning data by ensuring that data reads are taken within about ½ an SCLK edge of a 32 KHz clock edge. Without this feature, it might be possible to read inaccurate or old data.

Using the serial interface 128, the application processor 140 (FIG. 1) and/or the power manager 131, for example, may read and write to the PMU register bank 103 of the PMU 100 (FIG. 1). In this manner, the application processor 140 and/or the power manager 131 may control various aspects of the operation of the PMU 100, such as battery charging, power rail control, etc. Further, the application processor 140 and/or the power manager 131 may read system status information that is gathered and stored by the PMU 100 over time, to reference certain operating conditions of the system 10.

In the embodiments described herein, the power manager 131 is the master of the serial interface 128, generally, as it drives the SCLK signal. However, in other embodiments, the PMU 100 may be the master of the serial interface 128 and control or drive the SCLK signal. In operation, the serial interface 128 may operate at any suitable frequency for the application. In view of this difference in operating frequencies, according to certain aspects described herein, the serial communications interface slave 102 permits clock domain crossing. In this context, a clock domain crossing is achieved by avoiding metastability and/or unsettled data, when crossing between different clock domains of the serial interface 128 and the PMU 100. In this manner, the validity of data being written to and read from certain registers may be maintained. According to one aspect, direct latching is used, in part, to avoid metastability because certain direct latch registers are operated in the same clock domain as the serial interface 128. The use of direct latch registers also avoids delays incurred by the clock domain crossing. As further described below, the serial communications interface slave 102 permits direct latching and provides response codes after read and write operations occur via the serial interface 128.

Figure 3:
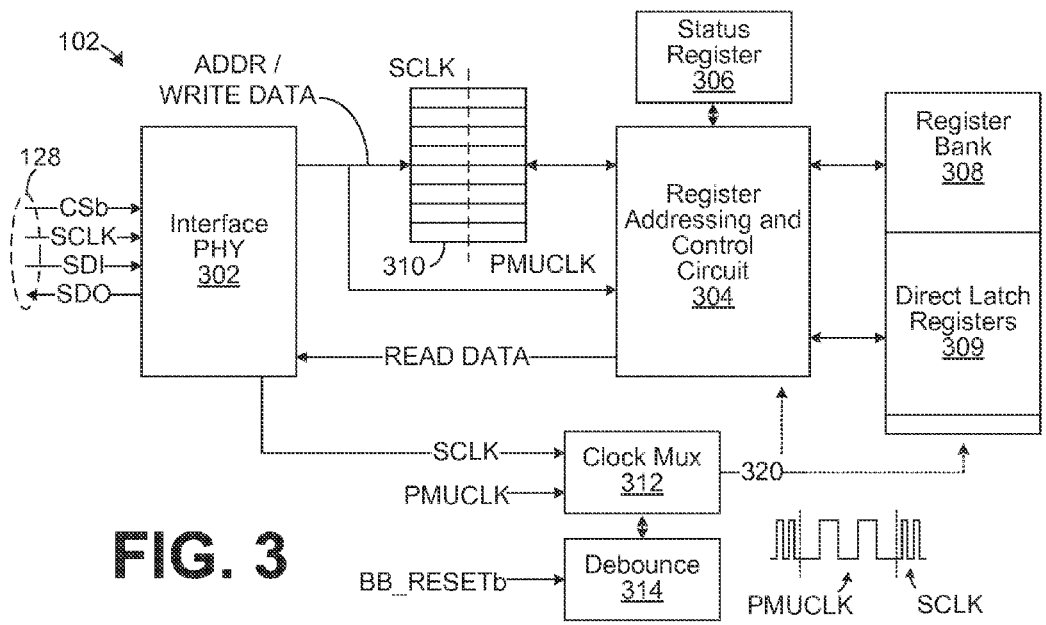
FIG. 3 illustrates a serial communications interface slave of the system of FIG. 1 according to an example embodiment.

FIG. 3 illustrates the serial communications interface slave 102 of the system 10 of FIG. 1 according to an example embodiment. As illustrated, the serial communications interface slave 102 includes an interface physical layer 302, a register addressing and control circuit 304, a status register 306, a register bank 308, a FIFO register 310, a clock multiplexer 312, and a debounce circuit 314. It is noted that the FIFO register 310 may include several (e.g., more or less than 16) registers including address and data registers. In one embodiment, the register bank 308 includes direct latch registers 309, although the register bank 308 and the direct latch registers 309 may be separate in other embodiments. The interface physical layer 302 is generally relied upon in the serial communications interface slave 102 for driving and buffering voltages on the channels of the serial interface 128 for data transmission, and for receiving and discriminating among voltage levels on the channels of the serial interface 128 for data reception.

In certain aspects, the register addressing and control circuit 304 resolves addresses received over the serial interface 128 to access the register bank 308, the direct latch registers 309, and the FIFO 310, and accounts for clock domain crossings during data communication over the serial interface 128, to avoid metastability. In other aspects, the register addressing and control circuit 304 also reads data from the FIFO 310 and writes the data to the register bank 308, and writes and maintains a status of the serial communications interface slave 102 in the status register 306. Thus, the register addressing and control circuit 304 may increment and decrement a counter in the status register 306 as data is written to and read from the FIFO 310. In one embodiment, the status register 306 may be used to store a count of the number of write entries in the FIFO 310, an indicator of when the FIFO 310 is full, and/or an indicator of when the FIFO 310 is empty. The status register 306 may be used to store additional status information in various embodiments.

The register bank 308 includes a memory register of the PMU 100, and may be embodied, at least in part, in connection with the PMU register bank 103 (FIG. 1). In general, the register bank 308 may be operated in the 32 Khz clock domain of the PMU 100. For example, when the PMU controller 101 writes and reads to the register bank 308, the writes and reads may occur in the 32 Khz clock domain of the PMU 100. Further, in one embodiment, when data is written from the serial interface 128 to the register bank 308, the data is first written to the FIFO 310 in the SCLK clock domain and then transferred to the register bank 308 in the 32 Khz clock domain of the PMU 100 by the register addressing and control circuit 304. Thus, the FIFO 310 may be relied upon to bridge the SCLK and PMU clock domains. In one embodiment, however, all data read from the register bank 308 for communication over the serial interface 128 may be read in the SCLK domain (e.g., 20 Mhz), to facilitate fast reads on the serial interface 128.

As illustrated in FIG. 3, the serial communications interface slave 102 includes the direct latch registers 309. Although data may be written from the serial interface 128 to the register bank 308 using the FIFO 310, data received over the serial interface 128 in association with a write address for access to the direct latch registers 309 is directly latched to the direct latch registers 309 (i.e., without being stored into the FIFO 310). Thus, according to one embodiment, data received over the serial interface 128 in association with a write address for access to the register bank 308 is written to the FIFO 310, while data received over the serial interface 128 in association with a write address for access to the direct latch registers 309 is directly latched to the direct latch registers 309. As noted above, the register addressing and control circuit 304 resolves addresses to determine whether data received over the serial interface 128 is to be written to the direct latch registers 309 or the register bank 308.

According to certain aspects, a tradeoff in power consumption vs. speed may be attained by operating the register bank 308 and the direct latch registers 309, at least in part, in different clock domains. The direct latch registers 309 may be organized to store power-sensitive operating parameters of the PMU 100, while the register bank 308 may be organized to store operating parameters which have a lesser impact on power consumption. For example, the direct latch registers 309 may be organized to store and control mode and voltage settings for certain ones of the power rails 120-124 which should be quickly placed into low power mode to conserve power. Thus, by relying upon the direct latch registers 309, one or more of the power rails 120-124 may be quickly powered down to conserve power within a relatively short period of time.

To provide the appropriate clock signal for synchronous operations in the serial communications interface slave 102, the clock multiplexer 312 generates a multiplexed output clock 320. The multiplexed output clock 320 may be provided, for example, to the register addressing and control circuit 304, the direct latch registers 309, and/or to any other elements of the serial communications interface slave 102, as needed. The multiplexed output clock 320 may be relied upon for writing to the direct latch registers 309. In one aspect, the multiplexed output clock 320 is relied upon by the PMU 100 for directly latching operating settings data from the OTP map 106 into the direct latch registers 309. The register addressing and control circuit 304 ensures valid and stable reads of all registers in the register banks 308 and direct latch registers 309. In that context, the register addressing and control circuit 304 and/or other elements of the serial communications interface slave 102 account for or avoid metastability during write and/or read operations. For example, metastability or unsettled data may be avoided by ensuring that write and/or read operations are taken within about ½ an SCLK edge of a 32 KHz clock edge of the PMU 100.

In one embodiment, the clock multiplexer 312 may multiplex between the SCLK and the PMUCLK (i.e., the 32 KHz clock of the PMU 100) based on at least one of a system operating status of the PMU 100 and a refresh control signal BB_RESETb from the host SOC 130. The refresh control signal BB_RESETb may be asserted by a logic low signal in one embodiment and be relied upon by the host SOC 130 to refresh the PMU 100 if the system 10 enters an error condition or state, such as if the host SOC 130 cannot communicate with the PMU 100 over the serial interface 128. The debounce circuit 314 may be relied upon in the serial communications interface slave 102 to condition and/or debounce the refresh control signal BB_RESETb, for example, over a multiple of the 32 KHz clock edge of the PMU 100.

In operation, the clock multiplexer 312 may output SCLK when the PMU 100 is operating in a HOSTON operating state and BB_RESETb is not asserted (i.e., logic high). The PMU 100 may operate in the HOSTON operating state, for example, so long as the system battery 182 (FIG. 1) is sufficiently charged for powered operation of the digital logic circuitry in the PMU controller 101. On the other hand, the clock multiplexer 312 may output PMUCLK when the PMU 100 is operating in a non-HOSTON operating state or whenever BB_RESETb asserted (i.e., logic low).

Figure 4A:
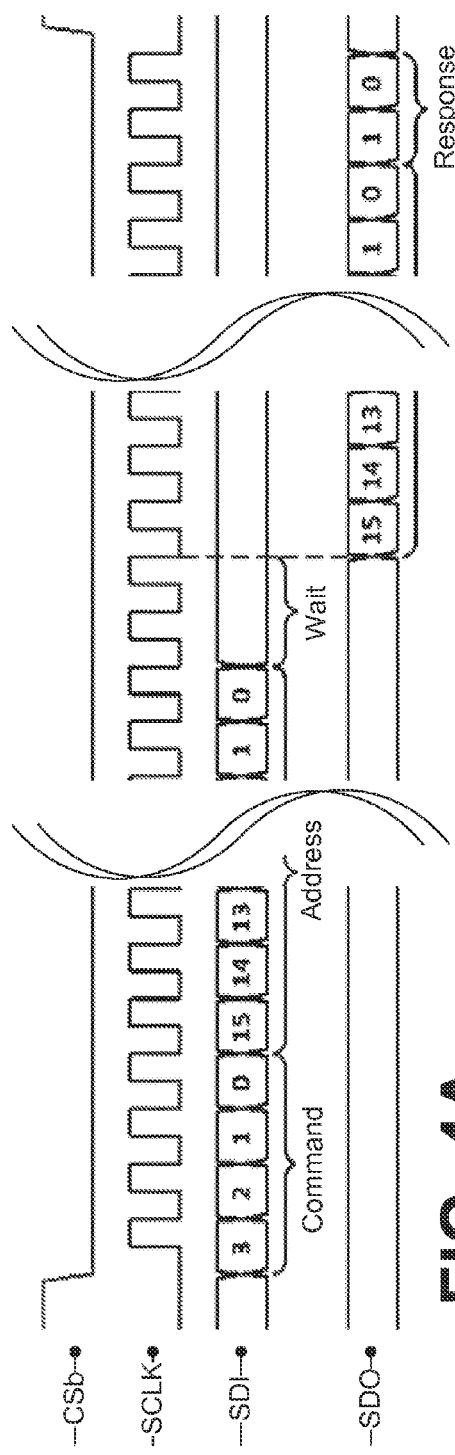
FIG. 4A illustrates a read timing diagram for communications over the serial interface of the system of FIG. 1 according to an example embodiment.

FIG. 4A illustrates a read timing diagram for communications over the serial interface 128 of the system 10 of FIG. 1 according to an example embodiment. As illustrated, the CSb channel falls to logic low for communication on the serial interface 128 to begin, and the SCLK channel is driven for synchronous operation. According to the protocol relied upon by the serial interface 128, in a read operation, a command is first written to the SDI channel followed by an address to access a register. In turn, the serial communications interface slave 102 (FIG. 3) resolves the command and the address to determine or distinguish between read and write commands and to identify whether to access either the register bank 308 or the direct latch registers 309. The command and address are followed by a wait time, during which the serial communications interface slave 102 (FIG. 3) accounts for and/or avoids any metastability as described herein. After the wait time, data is written by the serial communications interface slave 102 to the SDO channel, as illustrated, and the serial communications interface slave 102 communicates a response code back to the serial communications interface master 134.

In certain aspects of various embodiments, data may be clocked out on the falling edge of SCLK and clocked in on the rising edge of SCLK. With regard to interface commands, commands may include a bit for distinguishing between reads and writes and two bits for selecting one of 1, 4, 8, or 16 word bursts, among other bits. Further, the response code may include two bits for identifying states of OK, WRITE ERROR, READ ERROR, and OTHER ERROR, among other bits.

Figure 4B:
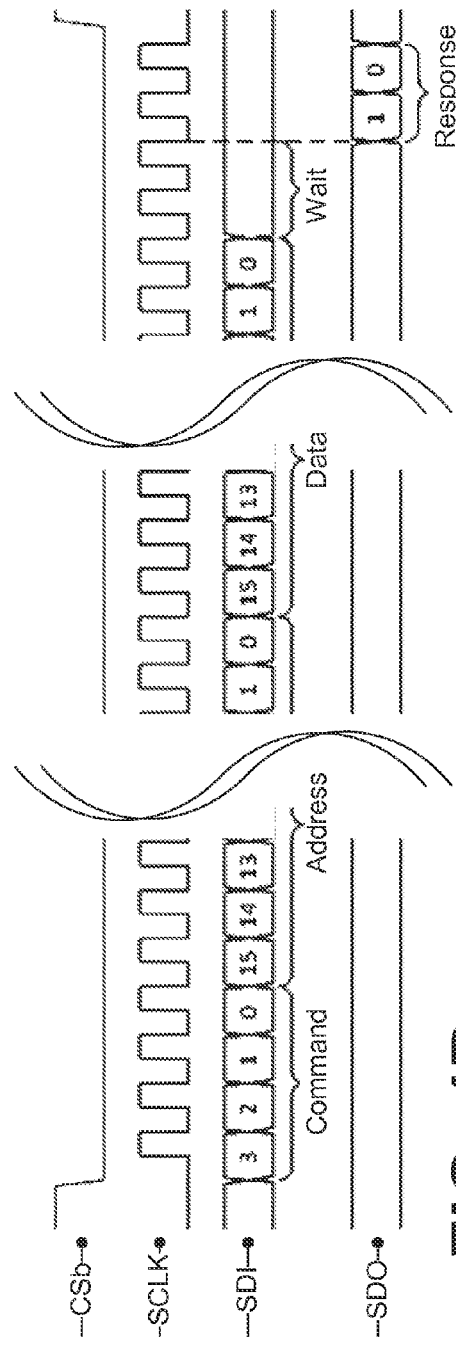
FIG. 4B illustrates a write timing diagram for communications over the serial interface of the system of FIG. 1 according to an example embodiment.

FIG. 4B illustrates a write timing diagram for communications over the serial interface 128 of the system 10 of FIG. 1 according to an example embodiment. As illustrated, the CSb channel falls to logic low, and the SCLK channel is driven for synchronous operation. According to the protocol relied upon by the serial interface 128, in a write operation, a command is first written to the SDI channel followed by an address to access a register. In turn, the serial communications interface slave 102 (FIG. 3) resolves the command and the address to determine or distinguish between read and write commands and to identify whether to access either the register bank 308 or the direct latch registers 309. The command and address are followed by data written by the serial communications interface master 134 (FIGS. 1 and 2) to the SDI channel. The data is followed by a wait time, during which the serial communications interface slave 102 (FIG. 3) accounts for and/or avoids any metastability as described herein. After the wait time, the received data is written by the serial communications interface slave 102 to either the register bank 308 or the direct latch registers 309, depending upon the address, and the serial communications interface slave 102 communicates a response code back to the serial communications interface master 134.

With regard to the response codes, a write error may occur, for example, when a write command is associated with an address to access the register bank 308 via the FIFO 310 (i.e., the address does not fall within the address range of the direct address register 309) and the FIFO 310 is full. Also, a read error may occur, for example, when a read command is associated with an address that overlaps with data in the FIFO 310 waiting to be written to the register bank 308 (i.e., a read-after-write error). In the case of a read error, the serial communications interface slave 102 may return NULL data as a further indication of the error condition.

FIG. 5A illustrates a burst read timing diagram for communications over the serial interface 128 of the system 10 of FIG. 1 according to an example embodiment, and FIG. 5B illustrates a burst write timing diagram for communications over the serial interface 128 of the system of FIG. 1 according to an example embodiment. The timing diagrams in FIGS. 5A and 5B generally follow the protocol principles described above with reference to FIGS. 4A and 4B, but are extended to illustrate burst read and write operations.

Figure 6:
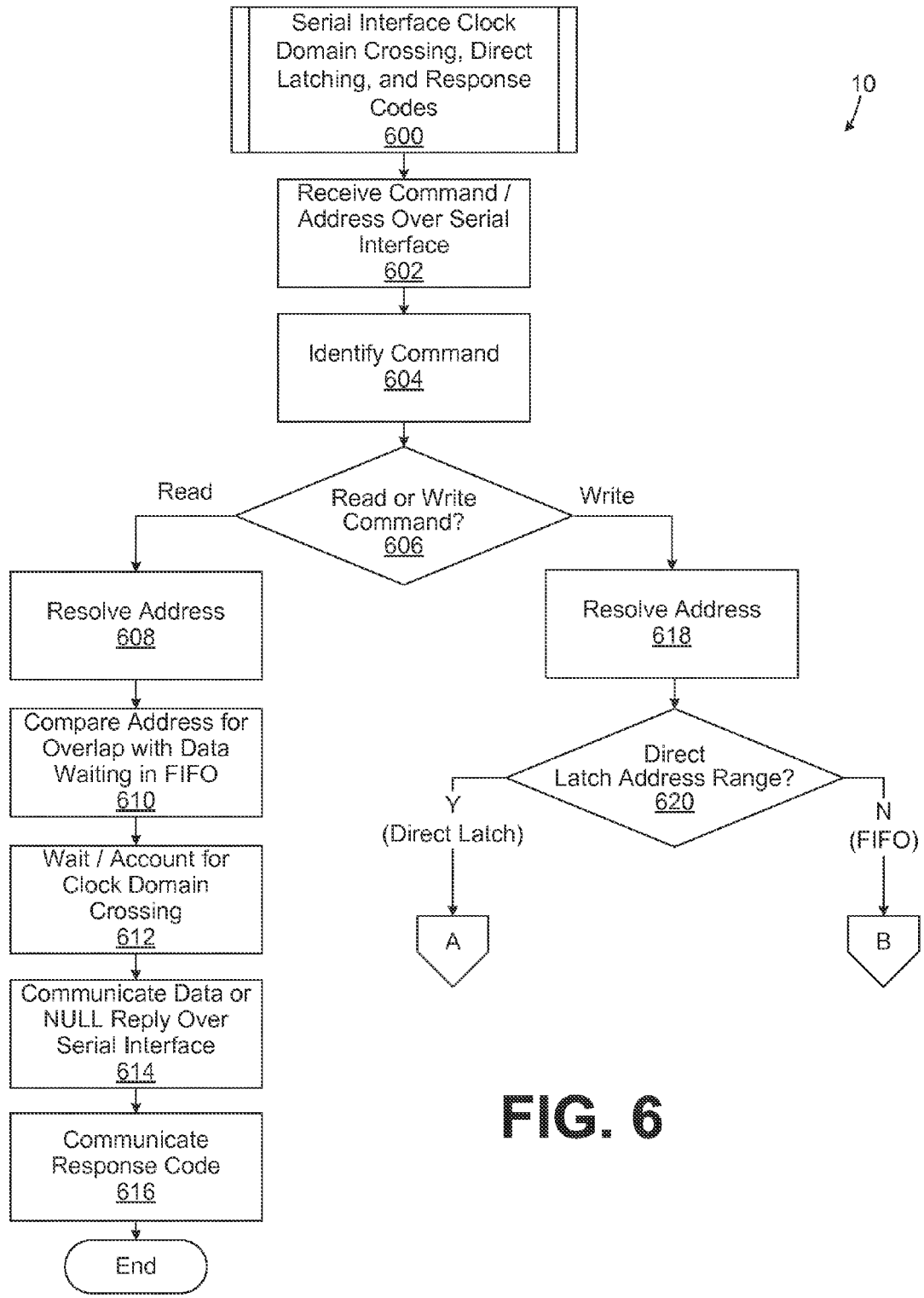
FIG. 6 illustrates a process flow diagram for a method of serial interface clock domain crossing, direct latching, and response codes performed by the system of FIG. 1 according to an example embodiment.
Figure 7:
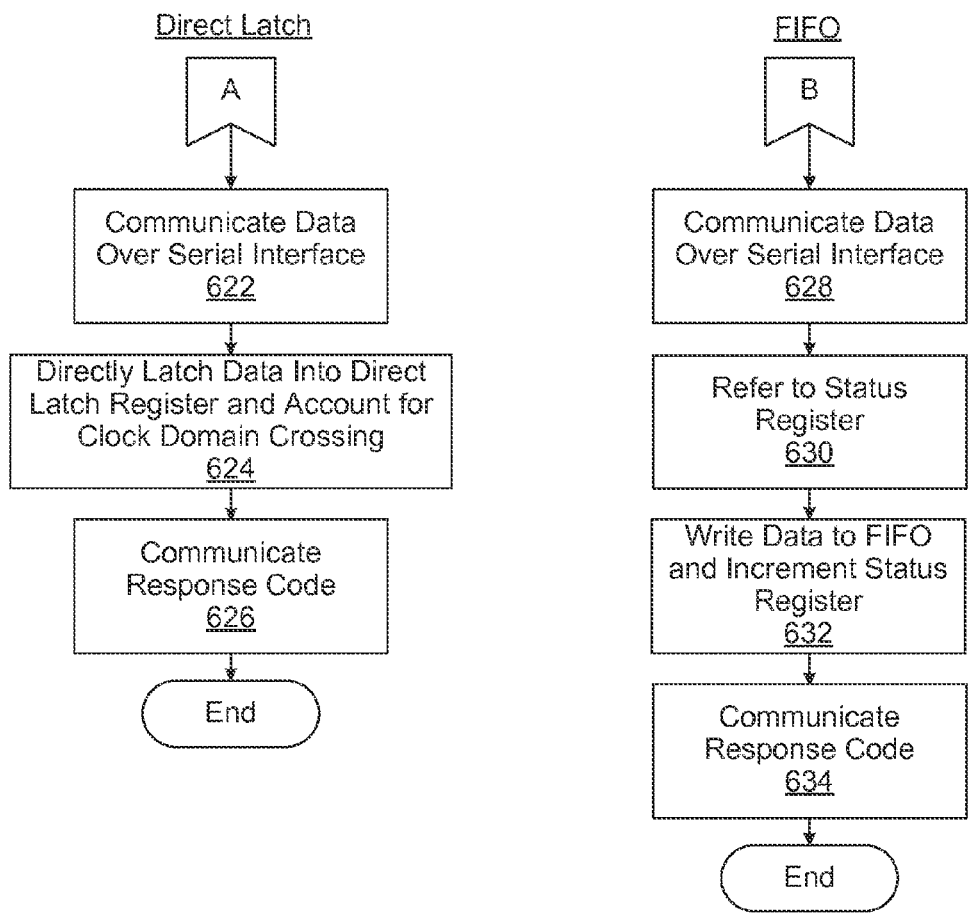
FIG. 7 further illustrates a process flow diagram for the method of serial interface clock domain crossing, direct latching, and response codes performed by the system of FIG. 1 according to an example embodiment.

Turning to FIGS. 6 and 7, process flow diagrams illustrating example processes performed by a system having a serial interface for clock domain crossing are provided. While the process flow diagrams are described in connection with the system 10 of FIG. 1, it is noted that other systems may perform the illustrated processes. That is, in various embodiments, systems similar to the system 10 may perform the processes illustrated in FIGS. 6 and 7.

In certain aspects, the flowcharts of FIGS. 6 and 7 may be considered to depict example steps performed by the system 10 according to one or more embodiments. Although the process diagrams of FIGS. 6 and 7 illustrate an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

FIG. 6 illustrates a process flow diagram for a method 600 of serial interface clock domain crossing, direct latching, and response codes performed by the system 10 of FIG. 1 according to an example embodiment, and FIG. 7 further illustrates the process flow diagram for the method 600.

Beginning at reference numeral 602, the process 600 includes receiving a data communication command and address over a serial interface. For example, a data communication command and address, as described herein, may be received over the serial interface 128 (FIGS. 2 and 3). Generally, the command and address are received by the serial communications interface slave 102 from the serial communications interface master 134 (FIGS. 1-3). At reference numeral 604, the process 600 includes identifying the data communication command received at reference numeral 602. Here, the serial communications interface slave 102 may identify whether the data communication command is a read or write command. At reference numeral 606, the process 600 includes proceeding to reference 608 when the data communication command is a read command, and proceeding to reference numeral 618 when the data communication command is a write command.

Turning to reference numeral 608 for a read command, the process 600 includes resolving the address received at reference numeral 602. For example, as described above with reference to FIG. 3, the address may be resolved by the serial communications interface slave 102 to determine whether to access either the register bank 308 or the direct latch registers 309. At reference numeral 610, the process 600 includes comparing the address for an overlap with data in a FIFO register waiting to be written to a register bank. Again, as described above in connection with FIG. 3, the address may be compared for any overlap with data in the FIFO 310 that is waiting to be written to the register bank 308. In this manner, a read-after-write error condition may be detected.

In some embodiments, the process 600 may include checking a status register of the serial interface 128, before or after data communication on the serial interface 128. With reference to FIG. 3, for example, the status register 306 may be checked to identify whether the FIFO 310 is full, etc. In this manner, for example, the serial communications interface master 134 may verify whether the FIFO 310 is full before reading or writing data to the register bank 308. Error conditions may be avoided if conflicts are identified with reference to the status register 306.

At reference numeral 612, the process 600 includes accounting for a clock domain crossing in association with the communicating. For example, when reading data from the register bank 308 to communicate over the serial interface 128, the serial communications interface slave 102 may account for or avoid metastability by ensuring that the data reads are taken within about ½ an SCLK edge of a 32 KHz clock edge of the PMU 100, as described herein.

At reference numeral 614, the process 600 includes communicating data or a NULL reply over the serial interface. For a read operation, the data communicated over the serial interface is the data which was stored in the register identified by the address received at reference numeral 602. In the condition of a read error, such as a read-after-write error, a NULL reply is communicated to indicate that the data associated with the address is in transition (i.e., waiting to be updated or re-written based on data waiting in the FIFO 310). Finally, at reference numeral 616, the process 600 includes communicating a response code. The response code may be communicated according to the examples described above to identify any error conditions. Otherwise, the response code may indicate a confirmation of the data transfer with an OK status indicator.

Turning to reference numeral 618 for a write command, the process 600 includes resolving the address received at reference numeral 602. Again, the address may be resolved by the serial communications interface slave 102 to determine whether to access either the register bank 308 or the direct latch registers 309. At reference numeral 620, the process 600 proceeds to either reference numerals 622 or 628 in FIG. 7, depending upon whether the address resolved at reference numeral 618 identifies access to the register bank 308 via the FIFO 310 or the direct latch registers 309.

Continuing to reference numeral 622 of FIG. 7, when a direct latch address is identified, the process 600 includes communicating data over the serial interface. Here, the data communicated over the serial interface 128 includes data communicated from the serial communications interface master 134 to the serial communications interface slave 102 to be written to the direct latch registers 309 of the PMU 100. At reference numeral 624, the process 600 includes directly latching the data into the direct latch register and accounting for a clock domain crossing. For example, the serial communications interface slave 102 may directly latch the data received at reference numeral 622 into the direct latch registers 309 of the PMU 100, while avoiding metastability or unsettled data by ensuring that the latch takes place within about ½ an SCLK edge of a 32 KHz clock edge of the PMU 100. Finally, at reference numeral 626, the process 600 includes communicating a response code. The response code may be communicated according to the examples described above to identify any error conditions or an OK status.

Continuing back to reference numeral 628 of FIG. 7, when a direct latch address is not identified, the process 600 includes communicating data over the serial interface. Here, the data communicated over the serial interface 128 includes data communicated from the serial communications interface master 134 to the serial communications interface slave 102 to be written to the register bank 308 of the PMU 100. At reference numeral 630, the process 600 includes referring to a status register. For example, the serial communications interface slave 102 may refer to the status register 306 to identify whether the FIFO 310 is full, or to identify another error condition. In certain embodiments, if an error condition is identified at reference numeral 630, then the process 600 may proceed immediately to reference numeral 634, to communicate a response code that indicates the error condition. At reference numeral 632, the process 600 includes writing the data into the FIFO 310. In turn, the data written to the FIFO 310 may be written to the register bank 308 by the serial communications interface slave 102, as described herein. Finally, at reference numeral 634, the process 600 includes communicating a response code. The response code may be communicated according to the examples described above to identify any error conditions or an OK status.

According to aspects of the embodiments described above. A system and method of a clock domain crossing serial interface is described. Using the interface, data may be directly latched into a direct latch register to increase speed in communications. Additionally, to conserve power, for example, data may also be written into a clock domain synchronizing FIFO register for ultimate access to lower speed register access. For both read and write operations, reference may be made to a status register of the serial interface to identify or mitigate error conditions, and wait times may be relied upon to account for a clock domain crossing. After each of the read and write operations, a response code including a status indictor may be communicated.

With regard to aspects of the structure or architecture of the system 10, in various embodiments, each of the PMU controller 101, the power processor 132, and or other processors or processing circuits of the system 10 may comprise general purpose arithmetic processors, state machines, or Application Specific Integrated Circuits ("ASICs"), for example. Each such processor or processing circuit may be configured to execute one or more computer-readable software instruction modules. In certain embodiments, each processor or processing circuit may comprise a state machine or ASIC, and the processes described in FIGS. 2 and 3 may be implemented or executed by the state machine or ASIC according to the computer-readable instructions.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

What is claimed is:

1. A method for serial interface clock domain crossing, the method comprising:
   identifying a data communication command received over a serial interface;
   decoding an address to determine whether the address falls within a direct latch address range of a register bank;
   communicating data over the serial interface; and
   generating a multiplexed output clock using a system clock and a Power Management Unit (PMU) clock, for writing to and reading from the register bank, based on at least one of a current system operating state and a refresh control signal from a host processor.

2. The method of claim 1, further comprising accounting for a clock domain crossing in association with communicating the data.

3. The method of claim 2, further comprising when the address falls within the direct latch address range, directly latching the data into a direct latch register of the register bank based on a clock signal of the serial interface.

4. The method of claim 1, further comprising:
   accounting for a clock domain crossing in association with communicating the data; and
   when the address does not fall within the direct latch address range, storing the data into a first-in-first-out (FIFO) register.

5. The method of claim 4, further comprising writing data from the FIFO register to the register bank.

6. The method of claim 1, further comprising, when the data communication command comprises a read command, communicating the data over the serial interface after a wait time.

7. The method of claim 1, further comprising, when the data communication command comprises a write command, communicating the data over the serial interface for writing to the register bank.

8. The method of claim 1, further comprising, after a wait time, communicating a response code over the serial interface.

9. The method of claim 1, further comprising, when the data communication command comprises a write command and the address does not fall within the direct latch address range, determining whether a first-in-first-out (FIFO) register is full.

10. The method of claim 9, further comprising, when determination is made that the FIFO register is full, communicating a write error response code.

11. The method of claim 1, further comprising, when the data communication command comprises a read command and the address overlaps with data in a first-in-first-out (FIFO) register waiting to be written to the register bank, communicating a read error response code.

12. A system for serial interface clock domain crossing, the system comprising:
   a communications interface configured to identify a data communication command received over a serial interface;
   register control circuitry configured to:
      decode an address to determine whether the address falls within a direct latch address range of a register bank;
      communicate data over the serial interface; and
   a clock multiplexer configured to generate a multiplexed output clock using a system clock and a Power Management Unit (PMU) clock, for writing to and reading from the register bank, based on at least one of a current system operating state and a system refresh control signal from a host processor.

13. The system of claim 12, wherein the register control circuit is further configured to:
   account for a clock domain crossing in association with data communication over the serial interface; and
   directly latch the data into a direct latch register of the register bank based on a clock signal of the serial interface when the address falls within the direct latch address range.

14. The system of claim 12, wherein the register control circuit is further configured to account for a clock domain crossing in association with data communication over the serial interface.

15. The system of claim 12, wherein the register control circuit is further configured to store the data into a first-in-first-out (FIFO) register when the address does not fall within the direct latch address range.

16. The system of claim 12, wherein the clock multiplexer is configured to multiplex between a clock of the serial interface and the system clock.

17. A method, comprising:
   receiving a data communication command and an address over a serial interface and determining that the data communication command comprises one of a read or a write command;
   resolving the address to access a register bank;
   decoding the address received over the serial interface to determine whether the address falls within a direct latch address range of the register bank;
   when the address does not fall within the direct latch address range of the register bank, storing data into a first-in-first-out (FIFO) register if the FIFO register is not full; and
   after a wait time, communicating a response code including a status indicator over the serial interface.

18. The method of claim 17, further comprising, communicating the data over the serial interface.

19. The method of claim 17, further comprising accounting for a clock domain crossing when directly latching the data into a direct latch register of the register bank based on a clock signal of the serial interface.

20. The method of claim 17, further comprising, when the FIFO register is full, communicating a write error response code.

* * * * *